United States Patent [19]

Eichelberger et al.

[11] Patent Number: 4,687,988
[45] Date of Patent: Aug. 18, 1987

[54] WEIGHTED RANDOM PATTERN TESTING APPARATUS AND METHOD

[75] Inventors: Edward B. Eichelberger, Hyde Park, N.Y.; Roger N. Langmaid, New Fairfield, Conn.; Eric Lindbloom, Poughkeepsie, N.Y.; Franco Motika, Hopewell Junction, N.Y.; John L. Sinchak, Wappingers Falls, N.Y.; John A. Waicukauski, Hopewell Junction, N.Y.

[73] Assignee: International Business Machines Corporation, Armonk, N.Y.

[21] Appl. No.: 748,288

[22] Filed: Jun. 24, 1985

[51] Int. Cl.⁴ .............................................. G01R 31/28
[52] U.S. Cl. ............................ 324/73 AT; 324/73 R; 371/25
[58] Field of Search ...................... 324/73 AT, 73 R; 371/25, 15

[56] References Cited

U.S. PATENT DOCUMENTS 4,594,711  6/1986  Thatte .............................. 324/73 R Primary Examiner—Ernest F. Karlsen
Attorney, Agent, or Firm—John D. Crane; Robert E. Sandt

[57] ABSTRACT

A method and apparatus for testing very large scale integrated circuit devices, most particularly Level Sensitive Scan Design (LSSD) devices, by applying differently configured sequences of pseudo-random patterns in parallel to each of the input terminals of the device under test, collecting the output responses from each of the output terminals in parallel, combining these outputs to obtain a signature which is a predetermined function of all of the sequences of parallel outputs and comparing the test signature with a known good signature obtained by computer simulation. The input test stimuli are further altered in a predetermined fashion as a function of the structure of the device to be tested, to individually weight the inputs in favor of more or less binary ones or zeros.

3 Claims, 6 Drawing Figures

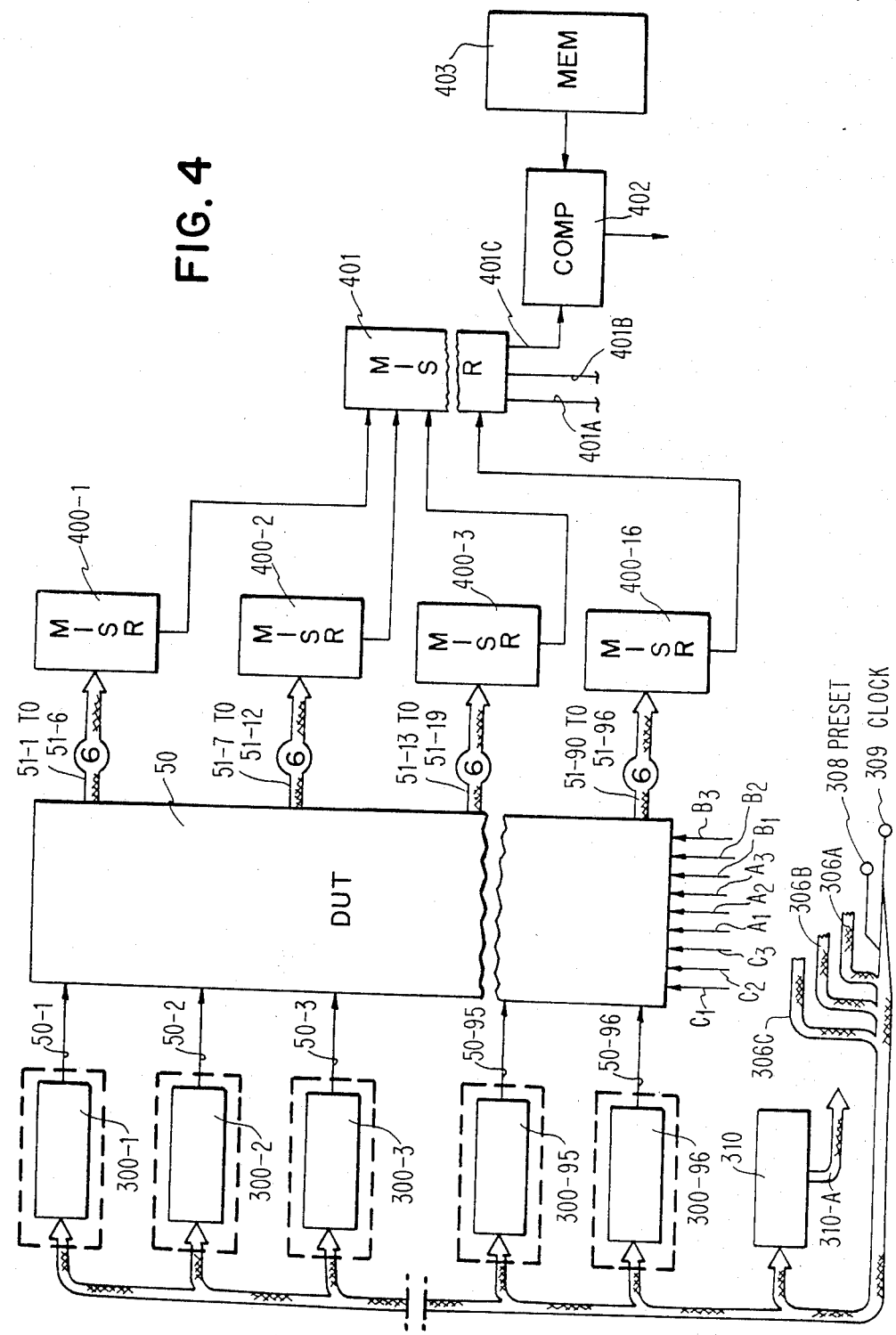

WEIGHTED RANDOM PATTERN TESTING APPARATUS AND METHOD

FIELD OF THE INVENTION

This invention relates to testing, and more particularly to the testing of very large integrated circuit devices.

DESCRIPTION OF THE PRIOR ART

Complex very large scale integrated circuit devices fabricated on a single semiconductor chip contain thousands of functional circuit elements which are inaccessible for discrete testing. Because of the complexity of the internal interconnections and their combinational interdependencies, testing for device integrity becomes increasingly time consuming as the number of circuit elements increases.

If by way of example a semiconductor chip were to have fifty input connections, the number of combinations of inputs is $2^{50}$. While one could apply that number of different input patterns, record the output responses, and compare those responses with the responses that ought to result, that is a herculean task and impossible for modern production testing.

A testing protocol as above-described, is described in the Giedd et al U.S. Pat. No. 3,614,608 assigned to the assignee of the instant application. To reduce the number of patterns required for testing Giedd et al employed a random number generator to generate the test patterns. This expedient considerably reduces the number of patterns needed to test a device. This is true because a random pattern generator, unlike a binary counter, produces a succession of binary words wherein the split between binary zeros and ones approaches a 50% split for a substantial number of successive words, which number of words is very considerably less than the total possible number of different words. Thus, each input to the device under test (DUT) has a 50% chance of receiving a binary zero or one input with a fewer number of input patterns.

A second expedient to reduce testing time is to employ weighted random patterns as inputs to the device under test (DUT). This ploy applies a statistically predetermined greater number of binary ones or binary zeros to the input pins of the DUT. The object is to apply a weighted test pattern that will have a maximum effect upon the inaccessible internal circuit elements.

A weighted random pattern test method is described by Carpenter et al in U.S. Pat. No. 3,719,885 assigned to the assignee of the instant application. They employed a pseudo-random pattern generator to produce a random succession of binary words which were decoded from binary to decimal and the decimal taps connected together in groups of two, three, four, five, etc. to produce multiple or weighted outputs from the decoder. These outputs are then applied to a bit change which produces an output whenever it receives an input.

A further dissertation on weighted random pattern testing can be found in an article by H. D. Schnurmann et al entitled "The Weighted Random Test-Pattern Generator", IEEE Transactions on Computers, Vol. C-24, No. 7, July 1975 at page 695 et seq.

Yet another expedient to improve testability is to build into the chip additional circuit connections for the sole purpose of testing. Obviously these circuits must be kept to a minimum, consistent with testing needs, because they reduce the availability of circuits for the routine function of the device. A device, exemplifying this built-in testability, is described in the Eichelberger U.S. Pat. No. 3,783,254, assigned to the assignee of the instant application. It will be seen from an examination of FIG. 6, which is a replication of FIG. 7 of the said Eichelberger Patent that the shift register portion of the device can receive inputs directly from an external connection and deliver an output, and are thus directly accessible for testing. This LSSD (level sensitive scan device) is most particularly suited for testing by the method and apparatus to be described.

Eichelberger, in U.S. Pat. No. 3,761,695, discloses a method specifically designed to test the foregoing LSSD device.

The use of "signatures" in lieu of a comparison of every individual test response with a known good output response is taught by Gordon et al in U.S. Pat. No. 3,976,864.

While the prior art testing methods were suitable for testing devices of the then-existing complexity, the increase in circuit density requires more sophisticated testing techniques, not only to reduce testing time, but to assure the functional integrity of these devices. While a defective integrated circuit cannot be repaired, it would be most useful if one were able to diagnose the failure mode of the device to at least a few fault-prone elements so that process changes in the manufacturing of the device could be instituted to minimize the number of faults.

SUMMARY OF THE INVENTION

It is therefore an object of the invention to provide improvements in the technique for testing complex, very large scale integrated circuit devices, and for diagnosing the failure mode of those devices which have failed to pass.

A further object is to provide a plurality of pseudo-random pattern generators as the source of input test patterns, to apply the test patterns in a predetermined succession of sub-sets, to a device to be tested while storing and analyzing the outputs responsive to those sub-sets of devices which fail to determine the probable faulty elements within the device.

Yet another object is to employ weighted random patterns as inputs to the device to be tested, wherein the weighting of the applied test patterns is a function of the number and kind of internal circuit elements that are directly or indirectly affected by an input signal on the respective input terminals of the device.

Another object in accordance with the preceding object is to provide an algorithm for computing the respective weights to be given to each input terminal.

The foregoing and other objects, features and advantages of our invention will be apparent from the following and more particular description of the preferred embodiments as illustrated in the accompanying drawings.

BRIEF DESCRIPTION OF THE DRAWINGS

FIG. 4 is a block diagram of the testing apparatus.

BRIEF DESCRIPTION OF THE PREFERRED EMBODIMENTS

Figure 1:
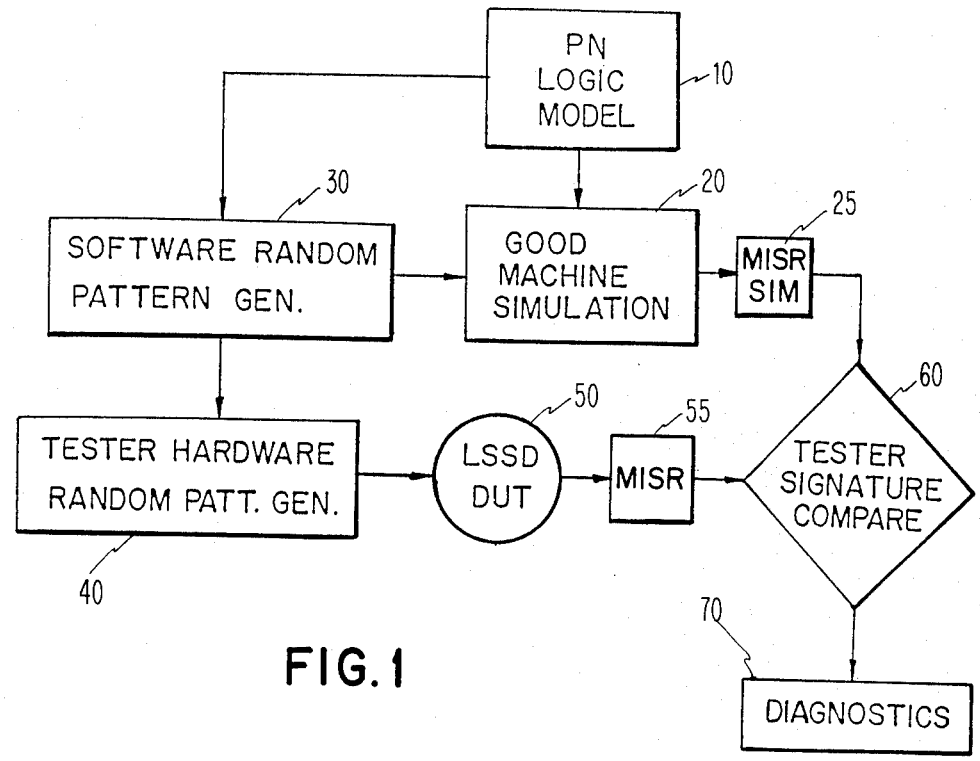
FIG. 1 is a block diagram of the testing protocol.

The broad, overall concept of the testing apparatus and method is shown in FIG. 1. Since the testing protocol is generic to a broad class of solid state devices, the development of a protocol for each individual point number starts with the part number logic model 10. This logic model is contained in a computer which contains a schematic diagram of each different part-numbered device with all of the interconnections between all of the internal functional elements between the input and output terminals plus the nature of each functional element i.e. shift register latch, AND gate, AND/INVERT gate, OR gate, OR/INVERT gate, etc.

This logic model (in computer software form) is entered into a computer segment 20, labelled good machine simulation, which is capable of simulating the output response of a good device at every point in a succession of input stimuli supplied by a software random pattern generator 30. The simulated responses from unit 20 are combined in a multiple input signature register simulator (MISR SIM) 25 which receives a succession of input responses from the good device simulation 20 and produces a derived function thereof.

When it is time to test a specific DUT, the unit 30 conditions the tester hardware random pattern generators 40 to apply the same patterns used in the simulation to the DUT 50, which device responds to these test patterns to produce a succession of test responses which are processed in a hardware MISR 25 to produce an actual signature.

The expected good signatures produced by simulation in unit 25 are stored in the tester and compared in the tester signature compare unit 60 to determine whether the DUT is bad or not bad. Bad devices are either discarded or subjected to a diagnostic routine unit 70, again a computer program which relies on the logic model 10 and a simulation of the stuck faults necessary to produce an output like that produced by a bad DUT.

Testing Concept

The testing protocol is designed to determine whether any of the internal functional circuit elements in a complex solid state device is stuck at zero or stuck at one. Testing speed is adjusted such that all circuit elements have sufficient time to obtain their respective stable states.

The devices to be tested and the testing protocol itself obey strict predetermined rules of binary logic. Thus, the output response of a device under test can at all times in the test cycle be predicted in advance as a function of the history of applied input stimuli. The word "history" has been chosen to denote that many logic devices produce outputs which are a function of both combinational and sequential logic.

Because of the complexity of the devices to be tested, their operation must be simulated in a computer to provide reference data against which the test outputs are compared. This is performed in advance of testing for each different device to be tested. During this advance simulation the optimum test protocol for each separate device is also determined.

The "optimum test protocol" is not to be construed that the computer determines in advance what specific test patterns shall be applied. It determines where and when the test patterns, whatever they may be, shall be applied to any specific device for the most definitive test. It also determines for each respective device which ones of the input terminals should preferentially receive binary ones or binary zeros and in what statistical ratio.

While the computer simulation does not pre-ordain the specific bit configurations of the applied test patterns, it can predict, by exploiting the known progressions of pseudo-random number generation what patterns will be applied and what the output responses thereto must be.

The testing protocol employs pseudo-random numbers as the source of test stimuli. A maximum capacity pseudo-random number generator of thirty-two bit capacity will produce $2^{32}-1$ words (numbers) each having a different bit capacity in each cycle of operation, and will repeat the same succession of words in all subsequent cycles. Therefore, if the generator at the start of test is initialized (preset) to a given fixed number (other than all zeros) the bit configuration of any pseudo-random number in the cycle will be known. At time zero (preset time) the bit configuration will be the present value. At any time subsequent thereto, the bit configuration will be defined by its relative position in the cycle. Again, by computer simulation, the pattern configuration can be defined and correlated with the position in the cycle. It could be stored in a table lookup, for example, as it is invariable.

In the tester a counter stepped in synchronism with the stepping of the pseudo-random generator selects which ones of the $2^{32}-1$ patterns shall be applied as input stimuli sources. As an example, if patterns 0-99 were to be used, the configuration of those patterns will be known. Because the pseudo-random patterns are used as a base for producing test patterns, those one hundred test patterns, by way of example only, will have an approximate statistical 50—50 split of binary ones and zeros. As the number of patterns increased, the split of zeros and ones increases to the limit of $(2^n-2)/2^n$.

Since 2 is very small compared to 2n, the effective ratio of zeros to ones is 1:1.

While the succession of input and output responses is known, the testing protocol does not compare the response of the DUT to each individual input. Rather it produces a derived function of a succession of output responses called for convenience a "signature" and compares it with a known good signature. The signature is a 32-bit binary number derived in a known regimented binary processor which receives a group of DUT output responses and derives the signature in response thereto. Since the input stimuli are known, the computer can simulate the individual good device responses thereto and derive the signature for any group of input responses.

When the tester produces a signature which mis-compares with the computer generated signature that device is defective. If the signatures compare, the device is determined to be not bad, but not necessarily good. It is only after a succession of signature comparisons all producing comparisons that a device may be determined to be good with a high degree of confidence.

Bad devices having a common fault signature will probably have a common internal fault, but not necessarily. Therefore, although a device may be cast aside when the first faulty signature is detected, it is useful for fault diagnosis to extend the test with several more groups of test patterns to determine if there is more than one faulty signature.

For fault diagnosis the device is retested only with those groups of patterns that yielded faulty signatures. During the diagnostic testing, signatures are not used, as they are not per se susceptible to analysis to locate faults. Their sole purpose is to speed up the decision of bad or not-bad.

For fault diagnoses the output response of the DUT to each individual successive input stimulus is recorded. These are compared by the computer to determine what pattern or patterns produced the faulty comparison. By computer simulation the operation of each circuit node within the device in response to the input pattern can be examined to determine which node caused the fault.

Pseudo-Random Pattern Generators

Figure 2:
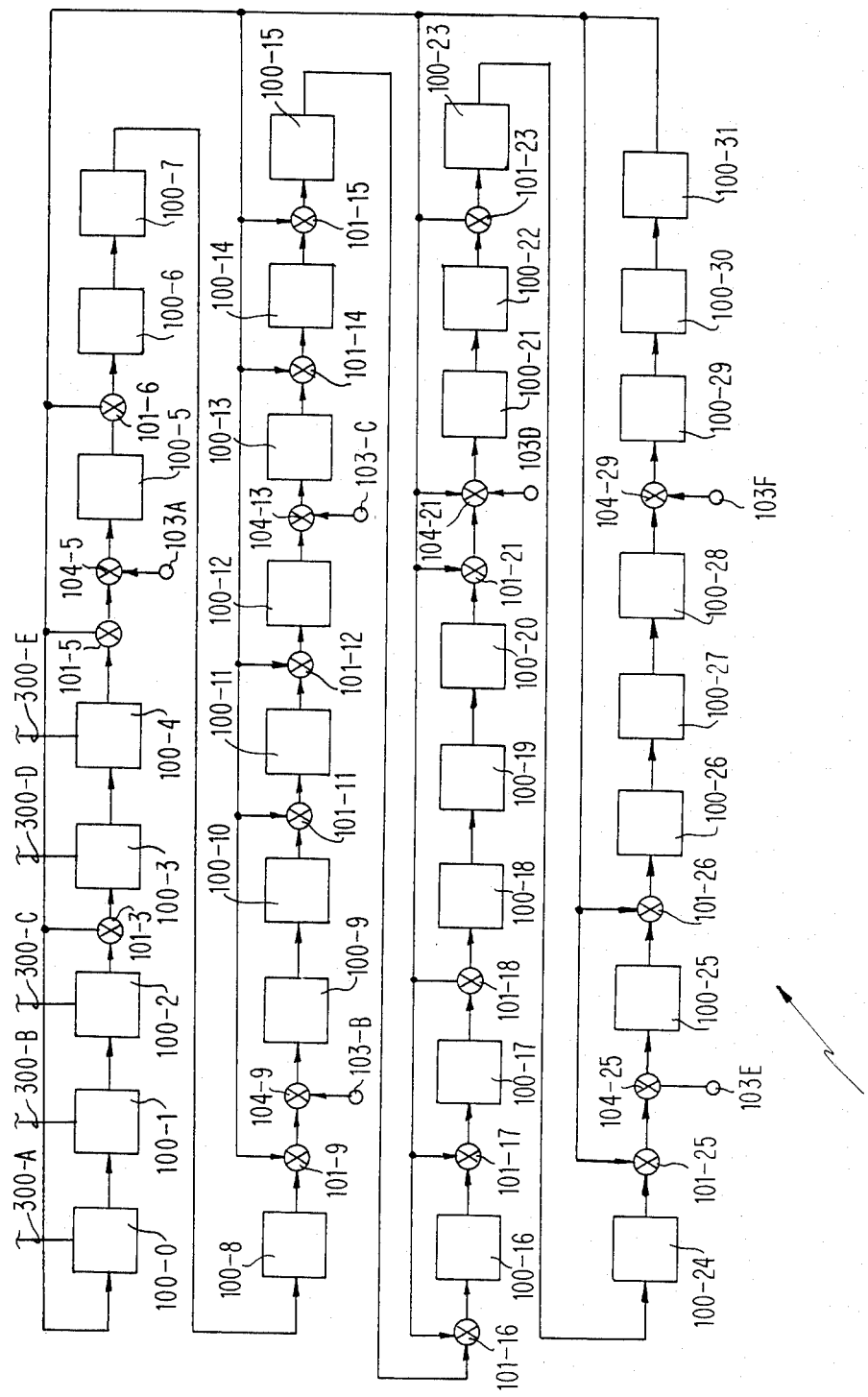
FIG. 2 a block diagram of a representative connection of a linear feedback shift register to junction as a pseudo-random pattern generator or a multiple input signature register.

All of the pseudo-random pattern generators and the multiple-input signature registers (MISR's) employ 32 bit linear feedback shift registers (LFSRs) 100 such as that shown in FIG. 2.

Each binary feedback shift register consists of 32 shift register stages 100-0 through 100-31 each stage having a connection to a common A and a common B clock line (not shown) which when alternately pulsed will shift each binary bit to the next succeeding stage.

To produce the pseudo-random patterns the output of the last stage 100-31 is coupled back and combined in an EXCLUSIVE OR gate 101-3, 101-5, 101-6, 101-9, 101-11, 101-12, 101-14, 101-15, 101-16, 101-17, 101-18, 101-21, 101-23, 101-25, and 101-26. With these feedback taps, which is but one of many feedback combinations, a complete sequence of $2^{32}-1$ pseudo-random patterns of thirty-two bits each will be repetitively produced in each cycle of operation. Each of the EXCLUSIVE OR gates in the 101 series will reverse the sense of the output from the preceding respective stage if the output of stage 100-31 is a binary one.

Each of the pseudo-random number generators used in the tester has a different set of feedback taps so that each produces a different sequence of random numbers. All produce a complete set. Each LFSR is initially preset to a different given "seed" number, other than all zeros. The preset line (not shown) is selectively connected to the set or reset input of each respective stage to preset the seed number.

With a known seed number and known configuration for each respective LFSR and a known number of shifts from the preset position the binary pattern of every pseudo-random pattern generator is known at every point in every cycle.

Not only does the use of parallel inputs increase the speed of operation versus serial operation, as one might expect, but more importantly the use of a differently configured random number generator, each providing a different sequence of random patterns reduces the statistical odds of any two input terminals repeatedly receiving the identical input stimuli. It reduces the interdependencies inherent in using a single pattern generator and a serial mode of operation.

The pseudo-random number generator of FIG. 2 is far superior to those described in the foregoing background patents. In those patents the multiple feedback taps were added in a modulo two adder and entered into the first stage. Necessarily, that required the cascading of many EXCLUSIVE OR gates, actually one less gate than the number of feedback taps. This slowed the repetition rate, as time was required for each gate to stabilize. In the FIG. 2 embodiment only one EXCLUSIVE OR gate is employed in the feedback loop occasioning only one delay.

When the linear feedback shift register (LFSR) is employed as a multiple input shift register (MISR) additional parallel inputs from the test output from the DUT are applied in parallel to the six terminals 103A through 103F these are introduced as inputs to the respective EXCLUSIVE OR gates 104-5, 104-9, 104-13, 104-21, 104-25, and 104-29. Like the feedback taps these parallel inputs will change the interstage bit shift only if a binary one is introduced. Where, as between the fourth and fifth stages, the feedback tap and the MISR input are connected to the same stage two serially connected EXCLUSIVE OR's (i.e. 101-5 and 104-5) are connected as shown.

While the LFSR's of FIG. 2, whether connected to operate as a pseudo-random number generator or a MISR, may be wired in any one of many ways, once wired they operate repetitively in a known manner obeying invariable logic rules. Therefore, the operation of each one is predictable and able to be simulated.

Weighting

Figure 3:
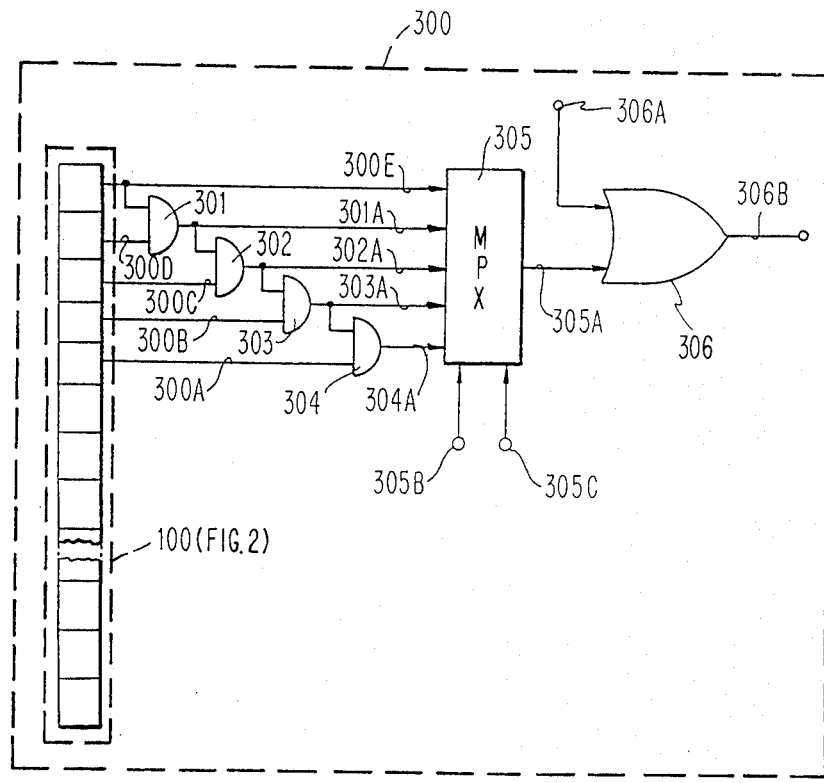
FIG. 3 is a weighting circuit for selecting the weighting of ones and zeros from the random pattern generator of FIG. 2.

When it is to be desired to weight the inputs to the DUT to produce a greater number of binary ones or zeros, the pseudo-random number generators of FIG. 2 have the additional circuitry shown in FIG. 3. None of the details of FIG. 2 is repeated. The pseudo random number generator 100 is assumed to have the feedback connections of FIG. 2 with a different combination for each separate random number generator.

The weighting circuit 300 takes the outputs of the first five stages of the LFSR 100 (FIG. 2) wired as a pseudo-random *pattern generator (without DUT inputs to make it a MISR), and connects them as shown directly, and through cascaded AND gates 301 through 304 to a weight selector 305. Each of the lines from the LFSR 100 will produce substantially a 50—50 split of zeros and ones. This is true because of the characteristics of a pseudo-random pattern generator. Thus the line 300E will produce 50% ones or zeros. However, when line 300E is "anded" with line 300D, the odds of producing a binary one at the output 301A of AND 301 will be only 25%. Conversely the odds, of producing a binary zero at this output will be 75%. By successive halving of the odds the odds of producing a binary one or zero on each of the output lines will be as follows:

| Line | Odds of One | Odds of Zero | Weights |
| --- | --- | --- | --- |
| 301E | 50% | 50% | 1:1 |
| 301A | 25% | 75% | 1:3 |
| 302A | 12.5% | 87.5% | 1:7 |
| 303A | 6.25% | 93.75% | 1:15 |
| 304A | 3.125% | 96.875% | 1:31 |

The weight selector and multiplexor functions to select one of the input lines 300E, 301A, 302A, 303A, or 304A to be gated through to the output line 305A and when it should be gated out. If the line 300A were selected for weighting (weight of 1), the weight selector and multiplexor would gate that line through upon every shift cycle of the LFSR 100. If line 301A were selected, the gating through would occur upon every second shift. For line 302A gating occurs every third shift, 303A every fourth shift, and 304A every fifth shift.

The reason for delaying the shift through for up to every five shifts is to reduce the interdependencies of successive patterns, and to approach most closely the statistical weightings shown in the foregoing table of values.

The control inputs 305B and 305C provide the selection of the input line and the time that it should be gated through. A final control is provided by input 306A which selects whether binary zeros or binary ones are to have the greater weight. Absent a control on 306A the EXCLUSIVE OR 306 will pass the output of line 305A unaltered providing an "odds of zero" output (col. 3 supra) on line 305B. Potentializing terminal 306A weights the outputs in favor of binary ones by reversing the sense of columns 2 and 3 supra, to provide a selection of weights of 1, 3, 7, 15, or 31 for binary ones.

Level Sensitive Scan Device

While the instant test method and apparatus is operative to test a great variety of solid state devices having many internal functional elements which are inaccessible for direct testing, it is particularly adapted for testing a level sensitive scan device such as that described by Eichelberger in U.S. Pat. No. 3,783,254.

Figure 6:
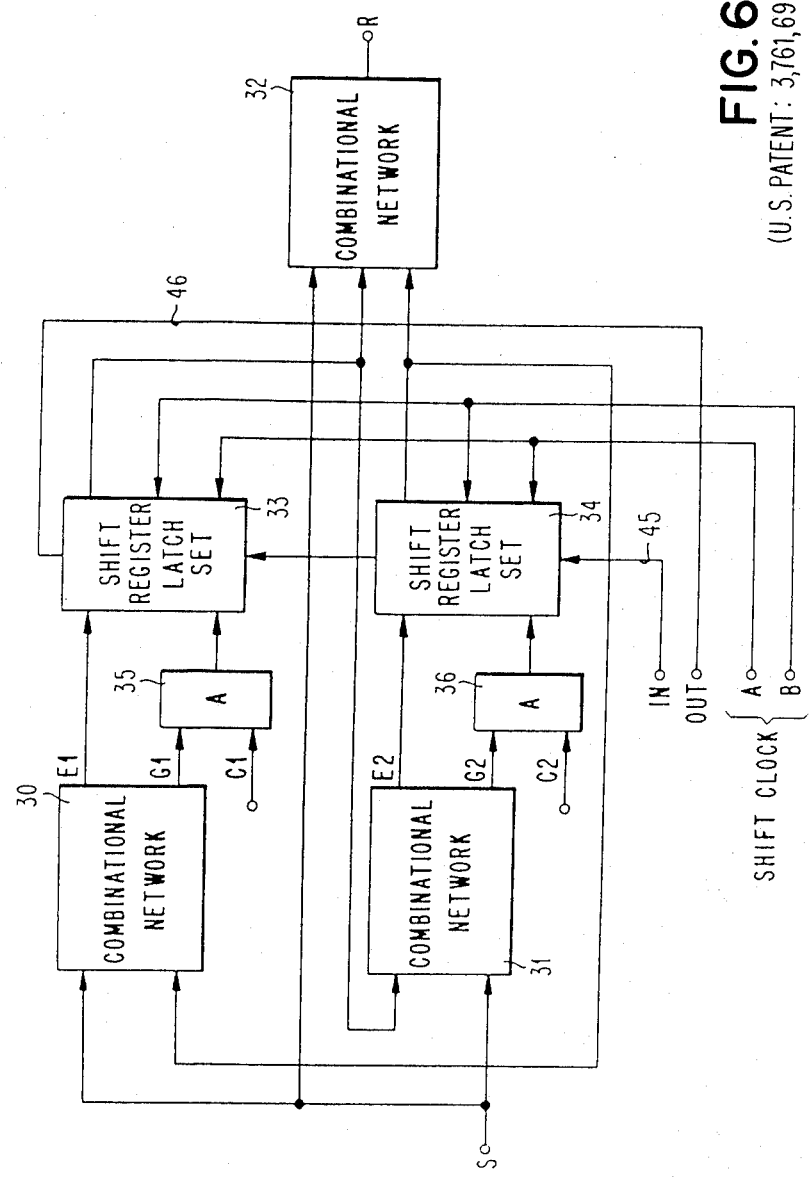
FIG. 6 a replication of FIG. 7 of U.S. Pat. No. 3,761,695 which is a schematic of a Level Sensitive Scan Design (LSSD) device.

For ease of reference FIG. 7 of Eichelberger has been reproduced herein as FIG. 6 with the same reference numbers. Data inputs to the LSSD (FIG. 6 of instant device) of Eichelberger are entered via the terminals denoted by "S" and "In" (line 45). As explained, the "S" inputs (stimulus) are sets of data and the circuitry of FIG. 6 will in an actual device be replicated many times. For purposes of explaining the operation of the test apparatus it will be assumed that there are three combinational networks like 30 and 31 each with its respective sets of inputs "S". It will further be assumed that there may be as many as three shift registers consisting of cascaded latch sets such as 33 and 34. In which case there will be a separate "IN" input for each of the shift registers.

Outputs include "R", which again includes many individual output lines, and line 46 "OUT" from the shift register which, if there are more than one would have an output for each shift register.

Control inputs include the "A" and "B" shift clocks for shifting data serially through the shift registers. These A & B clocks may be individual to each respective shift register. The $C_1$ $C_2$ and $C_3$ (not shown) are so-called system clocks which gate the outputs of the combinational logic into the respective latch sets. The "A" and "B" clocks are normally not used during operation of the LSSD device. They are reserved for testing. The "C" clocks are used during normal operation and for testing.

For an understanding of the complexity of testing an LSSD device it will be assumed that a device may have as many as ninety-six input and output terminals. This is for purposes of explanation only and not a limit as to the size or complexity of an LSSD device.

Test Apparatus Schematic

Recapping the explanation of the components making up the elements of the test system, namely the pseudo-random number generators, weighting circuitry, the MISR's and DUT itself, it has been explained how each of these components operates in accordance with invariable rules of logic and is thus susceptible to precise simulation by computer programming. The interplay of these components should now be apparent with reference to FIG. 4.

The DUT 50 is assumed to be an LSSD device as hereinabove described with respect to FIG. 6, having inputs 50-1 to 50-96, outputs 51-1 to 51-96 grouped into groups of six, and control inputs $A_1$, $B_1$ through $A_3$ $B_3$, and $C_1$ through $C_3$.

For each input there is a pseudo-random number generator and weighting circuit 300-1 to 300-96 such as that shown in FIG. 3. Each of these is wired to produce a full sequence of $2^{32}-1$ differently configured thirty-two bit binary patterns in a discretely different sequence, and each has its own weighting circuit. Initially each of the test pattern generators 300 is preset to its "seed" number by a control potential applied to input terminal 308 (not shown in either FIG. 2 or FIG. 3) but described as being selectively connected to the set or reset control of each latch stage to preset the seed number, different for each discrete unit, but always the same for any given unit. At this time the weight selection input for each unit 300 is entered at 305B, and weight zero or weight one for each unit 300 entered at 306A. If the maximum weighting for any one terminal input is thirty-one then the terminal 305C will enter a one out of five signal to all of the multiplexors 305 in all of the pattern generators 300 to gate the test patterns to the input terminals every fifth shift. For a lesser maximum weighting an input of one-out-of-four, one-out-of-three, one-out-of-two, or every shift will condition all of the multiplexors accordingly. The clock input 309 provides the clock inputs (A and B) pulses to shift the bits through the random number generator and clock the multiplexor 305 to gate a bit through according to the highest weighting assigned to any one input. The clock input also steps a thirty-two bit counter 310 which is reset by the same input 308 which presents the "seed" number. The output 310a of the counter is used to track the progression of random numbers through each of the random number generators, and to implement the instructions received from the computer as to the test protocol. For example, if the test protocol required applying test patterns ten thousand times to a given set of pin inputs the computer would order which ones of the $2^{32}-1$ patterns would be introduced. When the counter 310 produced a count corresponding to the computer ordered count the patterns would be gated to the respective DUT inputs, via multiplexors 305 (FIG. 3).

Thus, by correlating the pseudo-random number count with the computer simulation every pattern entered into the DUT is pre-ordained. For example, at count 9,856 the pattern in each respective pseudo-random number generator is known, as is the weighting for each respective input. It is also known for that count which ones of the pins are to receive an input. Therefore the input to each pin is known and is implemented by the tester in accordance with stored commands received from the computer, specific to the DUT.

Thus the DUT 50 can receive up to ninety-six inputs in parallel, each successive parallel set of inputs being pre-ordained.

As the DUT 50 receives each set of test inputs and the timing control inputs thereto are appropriately energized at the proper time, test responses will appear at the output lines 51-1 to 51-96 in groups of 6. Each of these groups of six is entered in parallel to the inputs of the LFSR 100 (FIG. 2) wired as a MISR 400-1 to 400-16 with inputs 103A through 103F. Thus each of the MISR's 400-1 through 400-16 will receive six parallel inputs for a total of ninety-six. For each successive set of parallel inputs the bit pattern existing in each of the MISR's will be shifted one bit position and altered, or not altered, as a function of the feedback taps and the parallel inputs. Thus a first level signature will be developed by each of the MISR's 400-1 through 400-16. When the predetermined number of test inputs and outputs has been produced, as for example 10,000 inputs and outputs, testing is temporarily halted and the contents of the MISR's 400-1 to 400-16 entered into the master MISR 401. Each of the first level MISR's contains a 32-bit sub signature which is a desired function of the succession of six parallel inputs applied thereto and the chosen configuration of the LFSR, together with the preset seed number.

The outputs of the sixteen first level MISR's are extracted serially therefrom and entered in parallel into sixteen of the stages of the master MISR 401 in thirty-two successive entries and shifts of the master MISR 401 and MISR's 401-1 to 401-16.

Each of the MISR's 400-1 to 400-16 and 401 has a preset line to preset them to a predetermined seed number and A and B clocks (none of which is shown). These MISR's may all be conveniently preset to the same seed number and have the same feedback taps, as they are not required to produce differently configured random numbers. Their only function is to produce a predictable desired signature in response to good outputs from the DUT. If they do not, the DUT is bad.

When each test sub-cycle is complete and MISR 401 has the desired signature, that signature is serially read out on line 401C by alternately pulsing the clock lines 401A and 401B to input the signature into comparator 402 which compares that signature with a known good signature for the test sub-cycle just completed, extracted from memory 403. All of the good signatures for each test sub-cycle are developed by computer simulation and pre-loaded into memory.

Upon completion of each sub-cycle, the MISR's are preset to their initial condition so that the results of previous tests will not contaminate the next test results. The pseudo-random pattern generators need not be reset, because the counter 310 and its count output will continue to keep track of the patterns as they are produced.

The timing of the various components including the DUT, must be conditioned to avoid any race conditions. All of the elements within the DUT must be allowed to obtain a stable state before the next set of test impulses is applied. Thus a master timing generator (not shown) provides the requisite timing to assure the achievement of the necessary stable states.

The use of signatures for every sub-cycle which may consist of as many as 10,000 discrete test inputs materially reduces test time because comparison need only be effected at the end of every sub-cycle rather than for every new set of pattern inputs. Through use of the MISR structure and a thirty-two bit signature register the probability of a bad DUT producing a good signature is so low as to be almost zero. Furthermore, by producing successive signatures, each with a different test protocol the probabilities of a test error are further reduced.

The number of test patterns to definitively test a complete LSSD device is reduced by employing a plurality of pseudo-random pattern generators, one for each input, each of which produces a different independent sequence of patterns.

LSSD Test Procedure

Although the advantages of the test method are applicable to a great variety of complex semiconductor devices having many internal functional elements which are not directly accessible for test purposes, these advantages are best illustrated by the testing method employed for a LSSD device.

As has been stated, to completely test a complex structure with all of the combinations and permutations of test inputs becomes prohibitively time-consuming when the number of inputs is increased.

The inherent flexibility of an LSSD for performing a great variety of logic operations makes it very popular for computer use. Therefore, in the following description it will be used to best illustrate the versatility of the testing method.

Reference will be made to FIG. 6 of the instant application as representative of a typical LSSD structure, which structure is more fully described in the Eichelberger U.S. Pat. No. 3,783,254 issued Jan. 1, 1974, from which FIG. 7 has been replicated herein.

The basic concept, as will be apparent, is to employ random patterns, weighted or unweighted, as test inputs, which random patterns, while structured, are to the maximum extent not interdependent.

After initiating the test equipment and conditioning it for a new DUT, the following steps are employed to test a typical LSSD:

(1) A succession of pseudo-randomly organized bits are applied in parallel to the "IN" (FIG. 6) terminals of all shift register inputs, however many they be, and are collected from the "out" terminals (FIG. 6) and entered in parallel (for a plurality of shift registers) in a succession of entries into the respectively connected stages of the MISR's. Since the shift register latches are also connected to the combinational network 16 (FIG. 6) the "R" outputs therefrom are concurrently collected and entered into the MISR's. While the latch outputs are also fed to the likes of combinational networks 10, 11, 12, these networks produce no "R" outputs because their outputs must be gated into latch sets by a system clock $C_1$–$C_3$. For each entry there must be a synchronized clocking of the pseudo-random number generators and the MISR's so that any outputs are discretely entered.

(2) Without resetting the MISR's step 2 follows. A single bit from each of the pseudo-random number generators, with or without weighting, is entered in parallel into the "S" inputs of the combinational networks 30, 31, and 32. Since some of these inputs notably to unit 32, will produce immediate outputs at "R", the "R" outputs resulting from the "S" entries are entered in parallel into the MISR's. The outputs from 30 and 31 are available for entry into the storage latches but not entered for the lack of a system clock pulse C.

(3) Without additional entries step 3 successively energizes the system clocks $C_1$, $C_2$, $C_3$, depending on the LSSD structure. Each of these system clocks will effect an entry into a storage latch and an output therefrom regeneratively to other ones of the combinational networks resulting in a change in the "R" outputs. The successive "R" outputs for each separate C clock are entered in parallel into the MISR's with a timed shift of the MISR's to accommodate each new entry.

(4) Step 4 pulses the LSSD "B" clock inputs to shift any bits resident in the storage latches (derived from outputs of the combinational logic) into the second of each pair of latches in a stage. This is preparatory to shifting out the contents of the latches operated as a shift register.

(5) The final step is to scan out the contents of the shift registers by alternately potentializing the LSSD A and B clocks. For each shift the MISR's are also shifted so that the shift register "OUT" signals and the "R" outputs will be collected by the MISR's.

It has been shown experimentally that there are some faults associated with the system and test clocks that will not be detected with repeated application of the above five steps. For these faults, variations of the basic sequence are required. One such variation repeats the basic sequence, omitting step 4, the pulse of the LSSD "B" clock. Another variation inserts an additional LSSD "A" clock DC turn-on and turn-off prior to step 4. A third variation exercises either a single system clock or no system clock ion step 3. The overall pattern application strategy consists of many repetitions of the basic five steps and relatively few repetitions of the special sequences.

This succession of steps is repeated perhaps as many as ten thousand times while the output responses are collected. At the end of test, the first level MISR's are read out serially and entered in parallel to the second level MISR to produce a final signature which is then compared to the signature produced by simulation.

It is to be noted and reemphasized that even though the test inputs are produced by random number generators, the sense of every bit introduced into the LSSD is known, and capable of simulation. So, too, the response of the LSSD to every input and to every clock pulse is predictable by simulation. The operation of the MISR's is also predictable so that the test-generated signature can be compared with the simulated signature. If, for example, there is no change in the output status of a given pin, either because there is no connection thereto or the particular test step produced no change, that phenomenon will be simulated to produce the simulated signature.

By virtue of the parallel operation of the tester, the use of differently structured pseudo-random number generators for each input, and the production of signatures in parallel with a final signature only after several thousand test patterns in which all elements of the DUT are exercised, testing is materially speeded with a very high percentage of accuracy.

Weighting Algorithm

Much of the reduction in the number of test patterns required to obtain definitive tests with a very high degree of accuracy is caused by intelligent weighting of the inputs. While weighting to test the function of the latches, when operated as a simple shift register, is not necessary, it does produce a substantial reduction in the required test patterns when testing combination logic networks.

The method and apparatus for producing and selecting various weights of binary zeros and ones by "anding" the outputs of successive stages of a pseudo-random pattern generator has previously described with respect to FIG. 3. Nothing was explained as to the rationale for the selection of a one or zero weight with respect to each individual device input.

The rationale for the selection is derived from an analysis of the device itself by computer analysis of all possible circuit paths from the output terminals of the device to the input device in accordance with the following rules and and algorithm.

Conceptually distributions of ones and zeros are the hundreds complement of one another. The exclusive OR gate 91 permits the weighting in favor of ones or zeros by applying a control one to the terminal 91a. A binary one control will reverse the sense of the output of the multiplexor, a zero control will preserve it.

For certain of the testing protocols, involving no weighting, only the pulses appearing on line 81E will be gated out and then every shift cycle to provide a 50—50 split of zeros and ones.

Weighting

Conceptually weighting is intended to preferentially apply a greater number of zeros or a greater number of ones to the input terminals of a device under test to increase the odds of detecting a malfunction of an internal circuit element that is not directly accessible for testing. Since there are many more internal circuit elements than there are input and output terminals an input on any given input pin will affect the operation of many internal elements. Conversely inputs to discretely different input pins will affect the operation of certain one or more elements affected by inputs on different input pins. The same is true of the response on the output pins.

Because different weights are to be assigned to individual pins, according to the number of internal circuit elements affected by an input signal on any input pin, the nature of the circuit elements, and the interconnection of the affected circuit elements, the weighting circuit shown in FIG. 2 must be replicated for every possible combination of weights and for every input, so as to reduce the probability of any two inputs to DUT receiving identical input stimuli. Thus, for every different pseudo-random number generator there is an associated weighting circuit with individual weighting controls.

The weight selection for any one input pin requires a sort of "daisy-chain" analysis wherein the last circuit element connected to an output pin is traced backward through all possible paths to one or more input pins. This is done for every path between each output pin through all possible paths to one or more input pins. The respective weights for each input pin is determined by the following series of calculations performed by a computer program which implements the algorithm of FIG. 3.

To test an AND circuit having twenty inputs requires about a million random patterns to test for the circuit output stuck at zero. This requires all twenty inputs to be at a one state. If each input has an equal chance to be one or zero then the chance of all twenty inputs receiving all ones is one out of $2^{20}$. If the probability of placing a one at the inputs were increased, the number of random patterns necessary for testing could be dramatically reduced. In general it is desirable to increase the probabilities of values at the device inputs that place non-controlling values on the logic blocks. One values are preferred on the inputs of AND inputs type blocks. However, one cannot ignore the possibility of one of the AND being stuck at one so that an input of all ones would not be a definitive test. There must, therefore, be a probability of placing at least one zero on each of the inputs of the AND gates to preclude the attendant gate being stuck at one.

Therefore, the probability of placing the non-controlling value at any input of the block should be increased according to the approximate formula:

$$P_{min} \cong (3-N-(N^2-2N+5)^{1/2})/(2-2N) \qquad (1)$$

where N=number of inputs to the block
The desired ratio of non-controlling value to the controlling value is given by $Rmin = \cong P_{min}/(1-P_{min})$.

For a four input AND the probability of placing a one level at each input should be 0.768 to minimize the number of random patterns necessary to test all stuck faults associated with the block. The probability for a five input AND gate is 0.809.

This probability calculation is only valid when the circuitry feeding each input is identical. This seldom occurs in practice so it is necessary to compensate for the differences in circuitry associated with the inputs of a block to achieve an accurate weight.

One way to compensate for the difference in input circuitry is to adjust probabilities based on the number of device inputs (primary inputs and LSSD latches) which control each input of the block. By this strategy, the odds of placing the non-controlling value of the block at an input would be increased by the ratio of the number of device inputs which control that block and the number of device inputs which control that input. This strategy accurately compensates for input complexity only for circuits which have no reconvergence or multiple fanouts. When these conditions exist, this strategy can result in over-compensation for the effect of differences in input circuitry.

Weight Calculation Algorithm

Actual experiments on a large number of different manufactured devices have shown that a better weighting strategy is an averaging of the strategies hereinabove described. These are the $P_{min}$ formula (1) and the adjustment to probabilities based on the number of device inputs (primary inputs and LSSD latches) which control each input of the block. The following steps are performed to determined the weighting factors associated with all device inputs.

A. Assign for each logic block in the circuit two numbers that represent the zero weight (W0) and the one weight (W1). These numbers are initialized to one. The ratio of the final values of W0 and W1 for the device inputs will indicate the odds of placing a zero value at that input.

B. Determine for each logic block in the circuit the number of device inputs (NDI) that logically control that block. C. Perform a backtrace from each device output (to an output pin or LSSD latch) as the backtrace proceeds backward from block X to block Y, W0 and W1 for block Y ($W0_y$ and $W1_y$) are adjusted depending on the logical function of block X in accordance with the following formula:

$$K = 0.5((NDI_x/NDI_y) + R_{min}(N_x)) \qquad (2)$$

where
$NDI_x$=number of device inputs controlling block X
$NDI_y$=number of device inputs controlling block Y
$N_x$=number of inputs to block X
$R_{min}$=block input weighting factor (formula 2 supra)

There are four cases corresponding to different logic functions of block X.

| X Block Type | W0 | W1 |
|---|---|---|
| AND | $W0_x$ | $K \times W1_x$ |
| AND-INVERT | $W1_x$ | $K \times W0_x$ |
| OR | $K \times W0_x$ | $W1_x$ |
| OR-INVERT | $K \times W1_x$ | $W0_x$ |

The new value of $W0_y$ will be the maximum of W0 from the above table and the old value of $W0_y$. Likewise, the new value for $W1_y$ will be the maximum of W1 and the old value of $W1_y$.

D. For each device input determine:
D1 Weighted value (WV). This indicates which value is to be weighted. If W0>W1, then WV=0. For the converse WV=1.
D2 Weight Factor (WF). This indicates the weighting factor associated with a device input. It is calculated by dividing the larger of W0 or W1 by the smaller one thereof.

Figure 5:
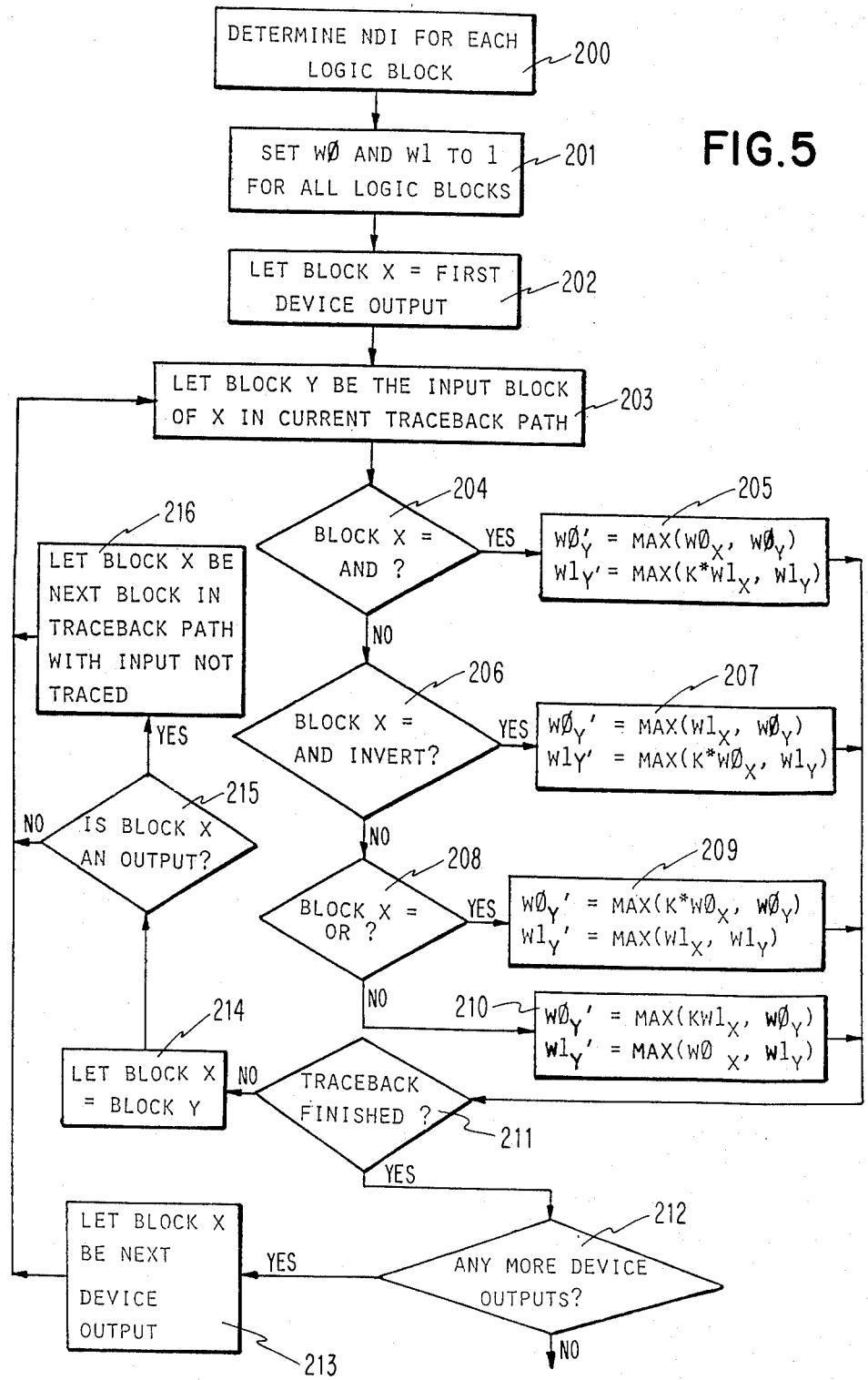
FIG. 5 is a flow diagram of the computer program for calculating weighting.

The calculation of the weighting is implemented by the program shown schematically in FIG. 5.

While the reference to the various logic blocks a "X" blocks or "Y" blocks is generic to any of a great variety of devices, in a computation of weighting of a specific device, each logic element within the device would have a unique identification number as would the input and output pins. Each logic element would be characterized by its logic function, and the connections to all other logic elements. Thus the computer by chaining can trace every path from each output pin to any input pin through all possible routes. The logic model 10 FIG. 1 contains this information and is used in conjunction with FIG. 3 to control the traceback.

The first step 200 is to use the logic model 10 (FIG. 1), stored in the computer to count the number of logic inputs for each logic block in the DUT and store the value for each. Since the logic model contains a schematic of the internal circuitry of the DUT, this is a simple count of the number of device inputs (not pin inputs) to each logic node.

The second step 201 merely initializes the zero weight (W0) and one weight (W1) for all logic blocks.

The third step 202 selects one logic block "X" connected to an output to begin the trace therefrom back to an input. It then selects one of the several input blocks to the selected "X" block and designates it as "Y". It then determines from the logic model the function of logic block X in steps 204, 206, or 208 and branches respectively to steps 205, 207, 209.

Depending on which of the branches is selected, the zero weight (W0y1) and the one weight (W1y1) are computed in accordance with the bracketed formulae, the details of which have previously been explained. The stored computation proceeds to block 211. If 211=YES the traceback is finished i.e., the traceback has proceeded to an input pin, and the computed value obtained in steps 205, 207, 209 or 210 is the weighted value for that pin.

However, the originally selected "X" block has multiple inputs, and if the currently chosen traceback path was the initial one, block 212=YES, signifying that one needs to return to block "X" and repeat the traceback from a second input to block "X" through another path. Block 213 in essence instructs the computer to return to block "X" and trace back through the next untraced path from block X, returning to block 203 and repeating the sequence through the sequence just traced. This sequence is repeated until all paths from X to an input have been traced.

If, in tracing back from the original X block the traceback does not reach an input pin via a single intervening "Y" block (211=NO). Then the original "Y" block becomes a new "X" block. That new X block may be an input (215=YES). In which case the trace proceeds to block 216 which returns the traceback to the original "X" block for a traceback through a second or third path therefrom.

If the new "X" block is not an input (215=NO) that new "X" block is the origin of the traceback proceeding from block 203, until an input pin is reached. This substitution of "X" for a "Y" block may occur several times until an input pin is reached.

When all of the outputs have been traced back to an input pin, each input pin will have a zero weight and one weight computed from all possible traceback paths. The greater of the zero weight or one weight is selected as the weighting for that particular pin. The appropriate weighting controls and timing of FIG. 3 are selected.

In the simulation each logic block has an identifying number, an identification of the kind of logic block, as well as the input and output connections to the preceding and succeeding logic blocks and input and output pins. The program schematic of FIG. 3, when implemented in a computer, would not use the "X" and "Y" designations but actual logic block ID. numbers. This simplifies the backtrace by eliminating the need to determine whether a "X" block is a terminal logic element or an intermediate one.

Diagnostic Testing

In a well-controlled device manufacturing line there will be relatively few bad devices. Since one-hundred percent testing is desirable it is expedient to design the testing protocol to segregate the bad devices in the shortest test time, and not to prejudice the test time of production testing in an attempt to find the defect in these few devices.

If for any reason production testing reveals an unacceptable level of quality or if one wishes to know the nature of the defects to improve the quality level, then diagnostic testing is advantageous.

Diagnostic testing in effect replicates the protocol employed in production testing but partitions the testing into small segments. Whereas the final signature of a bad device is not susceptible to fault analysis, the test results of small segments are. The summation of the test protocols of the segments is the same as the production test.

Given a bad chip (failed the production test) it is subjected to the following steps to develop a data bank which is then used to diagnose the defect that caused the device to fail.

Step I

A. The tester is initialized to the identical state employed in the production test which the device failed.

B. A segment length counter is initialized to the segment length desired.

C. The production test protocol is replicated for a number of iterations equal to the selected segment length and interrupted.

D. The final second level signature produced by the segment test is compared with the signature of a good device produced by simulation of testing of this segment. E. If the signatures compare, testing proceeds to the next following segments in succession until a bad segment is detected.

For a bad segment Step II is followed.

Step II

Re-test of a bad segment anywhere in the succession of segments.

A. Initialize the pseudo-random number generators to their respective states at the beginning of the segment test just run.
Note: This is of record and obtained by computer simulation of the known progression of pseudo-random numbers.

B. Initialize the MISRs to their respective states at the beginning of test of this segment.

C. Initialize the segment length counter for the segment length to be repeated.

D. Run the test to completion for this segment length and record
 1. The respective states of the pseudo-random generators at the start of this segment test.
 2. All bit patterns entered into the MISRs during the replicated production test for this segment.
 3. The number and kind of tester loops employed in this segment.

E. At the end of this bad segment test and data collection, proceed to Step III.

Step III

Segment Test Following a Bad Segment Re-Test

A. Initialize the pseudo-random pattern generators to the respective states they should occupy for the beginning of a segment test following a bad segment.
Note: Known by simulation.

B. Initialize the MISRs to their respective states they should occupy for the beginning of this segment, if preceded by no bad segment tests.
Note: Known by simulation C. Initialize the segment length counter for this next segment length.

D. Run the test to completion.

E. If good, proceed to next segment test.

F. If bad, re-test this segment as in Step II.

If, by way of example, the data for a bad device were collected for a segment length of one hundred, that data can be analyzed by fault simulation in a computer to pinpoint the internal elements stuck at zero or stuck at one. Since many of the internal elements will probably not be exercised by the few number of patterns within a segment, the task of determining which one or ones of the elements produced the faulty test output is materially reduced. The diagnosis can be enhanced if several segments which failed are similarly analyzed and reveal a common failure mode. Alternatively, analysis of a good segment could preclude a certain failure mode if that failure mode would have produced a bad test of a good testing segment. Should there be compensating defects in a device which in some instances might produce a good test of a segment, they could not be compensating in all instances. The segment tests will discover them.

As has been explained, LSSD devices obey strict logic rules so that the output response for any succession of input stimuli and cycle variations can be simulated. The input stimuli being generated by pseudo-random pattern generators are known at every instance in the test protocol. So, too, are the logic functions implemented by the MISRs to produce the signatures capable of simulation.

Therefore, whether a device is being production tested or diagnostically tested its response at every checkpoint can be simulated to provide signatures or other bit patterns against which a device under test can be compared.

With the method and apparatus as described,

1. Production testing time can be materially reduced with substantially fewer test patterns because of:
    a. Parallel input of test stimuli produced by pseudo-random pattern generators, each producing a different unique sequence of test patterns.
    b. The weighting of the input patterns as a function of the internal structure of the device to be tested, and
    c. The use of parallel signature generators which receive the output responses at each test interval and produce a gross signature indicating "goodness" or "badness" at the end of test.

2. Diagnostic testing for failure mode analysis employs the same protocol as production testing, but partitions the testing into small segments and produces a small set of data that can be analyzed for failure mode by fault simulation which is materially simplified by the small data set produced by the partitioning.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. An improvement in the method of testing of a complex integrated device having a LSSD shift register and accessible fewer input and output teriminals than the number of internally interconnected logic circuit elements coupled thereto which renders the elements inaccessible for discrete direct testing comprising the steps of:
    A. producing a pseudo random pattern containing one element for each accessible input terminal and inaccessible circuit element of the device to be tested;
    B. loading a portion of said pattern into the LSSD shift register of the device to be tested;
    C. applying a portion of said pattern to the accessible input terminals of the device under test;
    D. causing the device to operate in response to the inputs at the accessible input terminals and the data in the LSSD shift register;
    E. gating the signals from the logic circuit elements in the device under test into the LSSD shift register;
    F. unloading data from the LSSD shift register; and
    G. comparing the unloaded data with the precalculated data for a known good device to determine if the device under test failed;

a portion of said pseudo random pattern being operative to modify said loading of the LSSD shift register, said unloading of said LSSD shift register or the gating of patterns from the LSSD shift register to the inaccessible logic elements in the device under test, thereby providing a means for detecting all potential stuck faults resident in the LSSD combinational networks as well as a means for detecting faults in and amongst the LSSD shift clocks, the system clocks, and associated gating networks.

2. The improvement in the method as defined in claim 1; wherein each of said pseudo-random patterns consists of $2^n - 1$ different bit patterns and each pattern consista of n bits, and the same succession of patterns is repeated.

3. The improvement in the method as defined in claim 1, wherein a binary number signature is produced by the following succession of steps;
    A. producing a plurality of pseudo random patterns;
    B. for each said pseudo random pattern, forming the modulo-two sum of the first LSSD shift register output and the output from the output terminals of the complex integrated device with the bits in selected positions of a signature register, and modulo-two adding the remaining outputs of the LSSD register with selected positions of the signature register;
    C. at the end of the test modulo-two adding the data in the signature registers with selected bits of a further patterrn to form the binary number signature, said binary number signature comprising said unloaded data which is compared with said precalculated data.

* * * * *